United States Patent
Tu et al.

(10) Patent No.: US 7,176,129 B2
(45) Date of Patent: Feb. 13, 2007

(54) METHODS OF FABRICATING HIGHLY CONDUCTIVE REGIONS IN SEMICONDUCTOR SUBSTRATES FOR RADIO FREQUENCY APPLICATIONS

(75) Inventors: King-Ning Tu, Los Angeles, CA (US); Ya-Hong Xie, Beverly Hills, CA (US); Chang-Ching Yeh, Santa Clara, CA (US)

(73) Assignee: The Regents of the University of California, Oakland, CA (US)

( * ) Notice: Subject to any disclaimer, the term of this patent is extended or adjusted under 35 U.S.C. 154(b) by 135 days.

(21) Appl. No.: 10/299,451

(22) Filed: Nov. 19, 2002

(65) Prior Publication Data

US 2003/0148598 A1    Aug. 7, 2003

Related U.S. Application Data

(60) Provisional application No. 60/331,854, filed on Nov. 20, 2002.

(51) Int. Cl.
*H01L 21/44* (2006.01)

(52) U.S. Cl. .......... 438/667; 257/E23.01; 257/E23.079

(58) Field of Classification Search ............... 438/381, 438/400, 405, 430, 453–454, 466, 469, 597–598, 438/674, 762, 765–766, 769–772, 960
See application file for complete search history.

(56) References Cited

U.S. PATENT DOCUMENTS

| | | | |
|---|---|---|---|
| 4,507,849 A | | 4/1985 | Shinozaki |
| 5,166,097 A | | 11/1992 | Tanielian |
| 5,200,639 A | | 4/1993 | Ishizuka et al. |
| 5,508,211 A | * | 4/1996 | Yee et al. ................... 438/400 |
| 5,618,752 A | | 4/1997 | Gaul |
| 5,644,156 A | * | 7/1997 | Suzuki et al. ................ 257/485 |
| 5,665,633 A | | 9/1997 | Meyer |
| 5,767,561 A | * | 6/1998 | Frei et al. .................... 257/499 |
| 5,889,314 A | * | 3/1999 | Hirabayashi ................. 257/508 |
| 6,251,739 B1 | | 6/2001 | Norstrom et al. |
| 6,261,892 B1 | | 7/2001 | Swanson |
| 6,432,724 B1 | * | 8/2002 | Ahn et al. ................... 438/667 |
| 6,459,134 B2 | * | 10/2002 | Ohguro et al. ............... 257/501 |
| 6,670,703 B1 | * | 12/2003 | Ahn et al. ................... 257/691 |
| 6,852,605 B2 | * | 2/2005 | Ng et al. ..................... 438/381 |
| 6,911,348 B1 | * | 6/2005 | Becker et al. ................ 438/10 |
| 7,071,052 B2 | * | 7/2006 | Yeo et al. .................... 438/238 |
| 2001/0023111 A1 | * | 9/2001 | Yuan .......................... 438/409 |
| 2002/0022362 A1 | * | 2/2002 | Ahn et al. ................... 438/667 |

(Continued)

FOREIGN PATENT DOCUMENTS

EP    0 932 204 A1    7/1999

*Primary Examiner*—Michael Lebentritt
*Assistant Examiner*—Andre' Stevenson
(74) *Attorney, Agent, or Firm*—Gates & Cooper LLP

(57) ABSTRACT

Methods of fabricating highly conductive regions in semiconductor substrates for radio frequency applications are used to fabricate two structures: (1) a first structure includes porous Si (silicon) regions extending throughout the thickness of an Si substrate that allows for the subsequent formation of metallized posts and metallized moats in the porous regions; and (2) a second structure includes staggered deep V-grooves or trenches etched into an Si substrate, or some other semiconductor substrate, from the front and/or the back of the substrate, wherein these V-grooves and trenches are filled or coated with metal to form the metallized moats.

7 Claims, 7 Drawing Sheets

U.S. PATENT DOCUMENTS

2002/0155655 A1* 10/2002 Pon .............................. 438/238
2004/0217440 A1* 11/2004 Ng et al. ..................... 257/528
2005/0124131 A1* 6/2005 Hweing et al. .............. 438/381

* cited by examiner

METHODS OF FABRICATING HIGHLY CONDUCTIVE REGIONS IN SEMICONDUCTOR SUBSTRATES FOR RADIO FREQUENCY APPLICATIONS

CROSS-REFERENCE TO RELATED APPLICATION

This application claims the benefit under 35 U.S.C. §119 (e) of the following co-pending and commonly-assigned U.S. Provisional Patent Application Ser. No. 60/331,854, entitled "METHODS OF FABRICATING HIGHLY CONDUCTIVE REGIONS IN SEMICONDUCTOR SUBSTRATES FOR RADIO FREQUENCY APPLICATIONS," filed on Nov. 20, 2002, by KingNing Tu, Ya-Hong Xie and Chang-Ching Yeh, which application is incorporated by reference herein.

BACKGROUND OF THE INVENTION

1. Field of the Invention

The invention relates to fabricating semiconductor devices, and more particularly, to methods of fabricating highly conductive regions in semiconductor substrates for radio frequency applications.

2. Description of the Related Art

It has been a recent trend in the Si (silicon) integrated circuit industry to integrate radio transmitters and other radio frequency (RF) devices onto digital integrated circuits. Such integration requires RF shielding to prevent interference with other noise sensitive portions of the integrated circuits.

Oxidized porous Si has been used to provide effective DC (direct current) isolation. However, oxidized porous Si cannot be made too thick because of the thermal expansion coefficient mismatch between oxidized porous Si and Si. Therefore, it cannot be used for effective RF shielding, similar to silicon nitride and silicon dioxide films. On the other hand, the use of unoxidized porous Si as an insulating material has been successful in reducing RF crosstalk to a level identical to that across a vacuum.

However, there is a need in the art to further reduce crosstalk for high-end RF applications. The present invention satisfies that need.

SUMMARY OF THE INVENTION

The present invention describes methods of fabricating highly conductive regions in semiconductor substrates for radio frequency applications. These methods are used to fabricate two structures: (1) a first structure includes porous Si regions extending throughout the thickness of an Si substrate that allows for the subsequent formation of metallized posts and metallized moats in the porous regions; and (2) a second structure includes staggered deep V-grooves or trenches etched into an Si substrate, or some other semiconductor substrate, from the front and/or the back of the substrate, wherein these V-grooves and trenches are filled or coated with metal to form the metallized moats.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Figure 1:
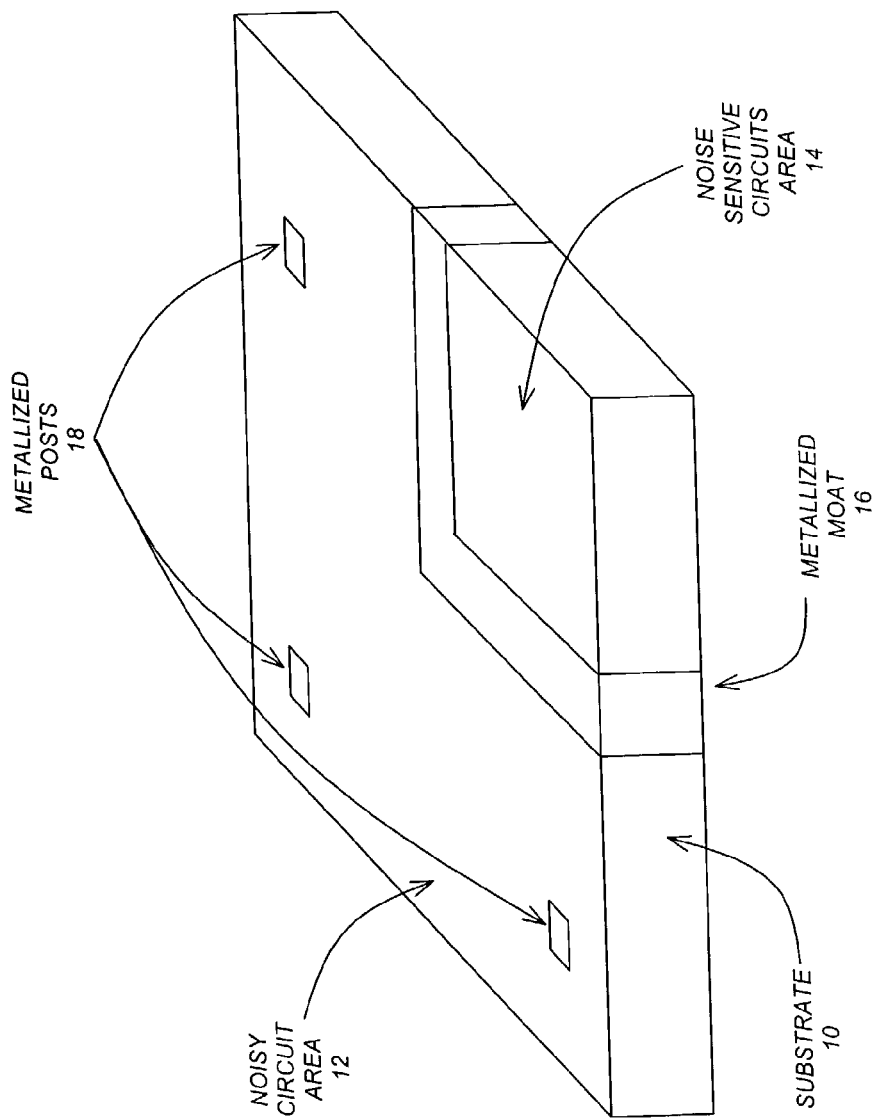
FIG. 1 illustrates a structure for incorporating highly conductive metallic regions into semiconductor substrates according to the preferred embodiment of the present invention.

FIG. 1 illustrates a structure for incorporating highly conductive metallic regions into semiconductor substrates according to the preferred embodiment of the present invention. A Si substrate 10 is divided into a noisy circuit area 12 and a noise sensitive circuit area 14, which are separated by a metallized moat 16. The highly conductive metallized moat 16 is formed from metallized porous Si regions extending through the thickness of the substrate 10. The noisy circuit area 12 also includes metallized posts 18, created from metallized, localized porous Si regions and extending through the thickness of the substrate 10, wherein the metallized posts 18 act as "true ground" points.

Figure 2:
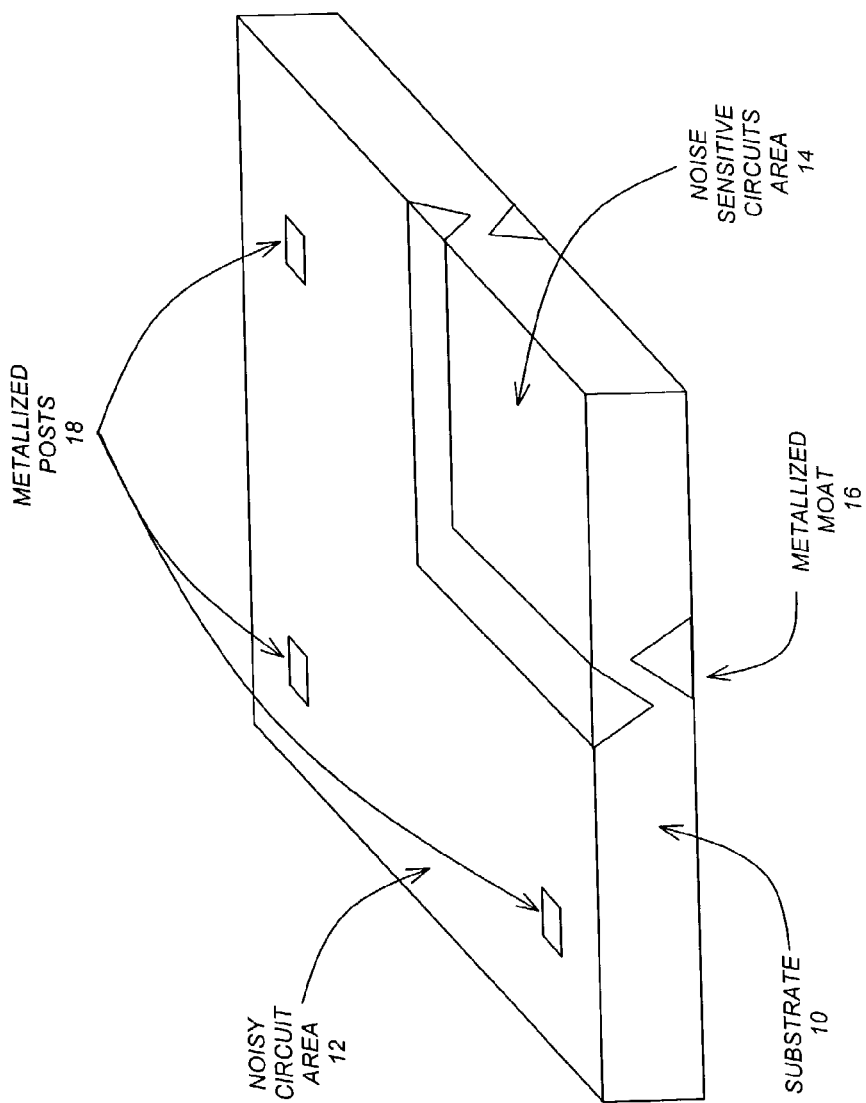
FIG. 2 illustrates an alternative embodiment of FIG. 1, wherein a highly conductive metallized moat is formed by staggered deep V-grooves etched into the substrate.

FIG. 2 illustrates an alternative embodiment of FIG. 1, wherein the highly conductive metallized moat 16 is formed by staggered deep V-grooves etched into the Si substrate 10, from both the front and the back of the substrate 10, wherein these V-grooves are filled with metal.

Figure 3:
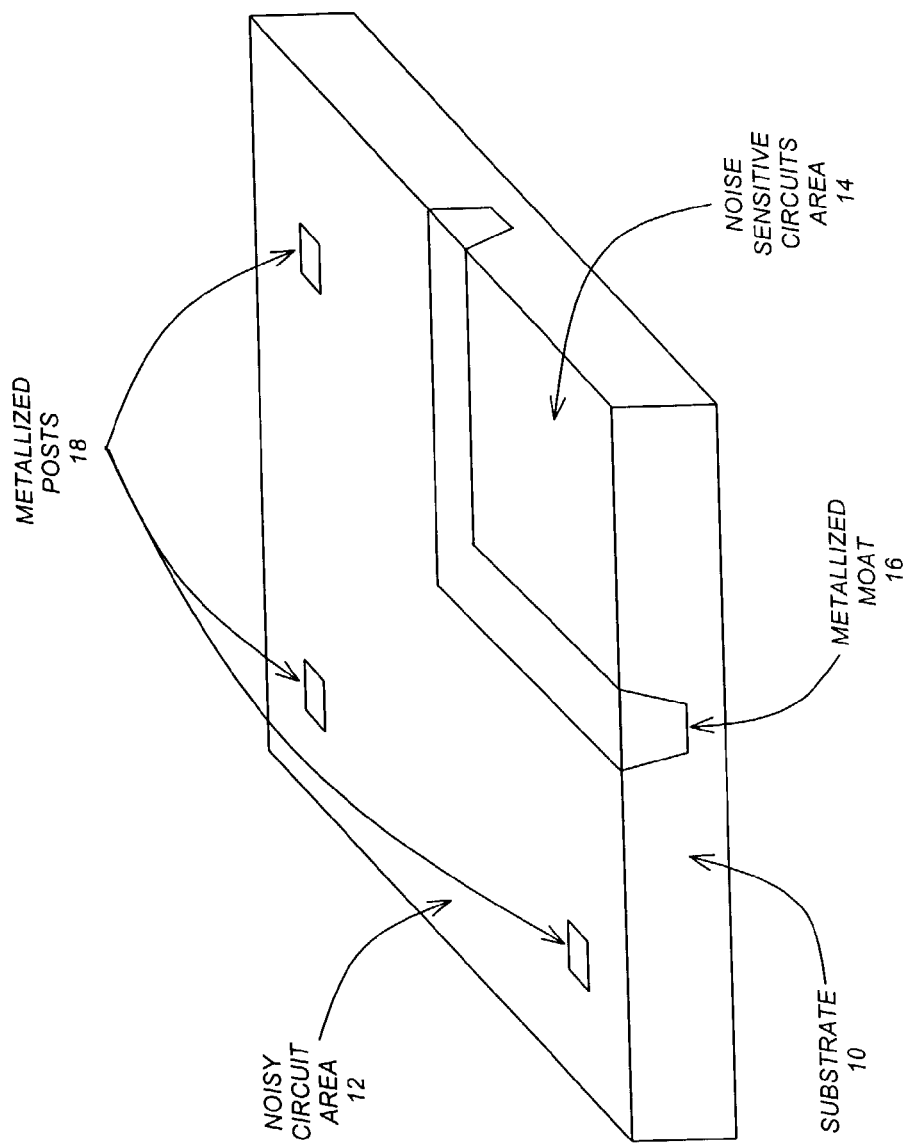
FIG. 3 illustrates an alternative embodiment of FIG. 1, wherein a highly conductive metallized moat is formed by a deep trench etched into the substrate.

FIG. 3 illustrates an alternative embodiment of FIG. 1, wherein the highly conductive metallized moat 16 is formed by a deep trench etched into one side (either front or back side) of the Si substrate 10, wherein the trench is also filled with metal.

Figure 4A:
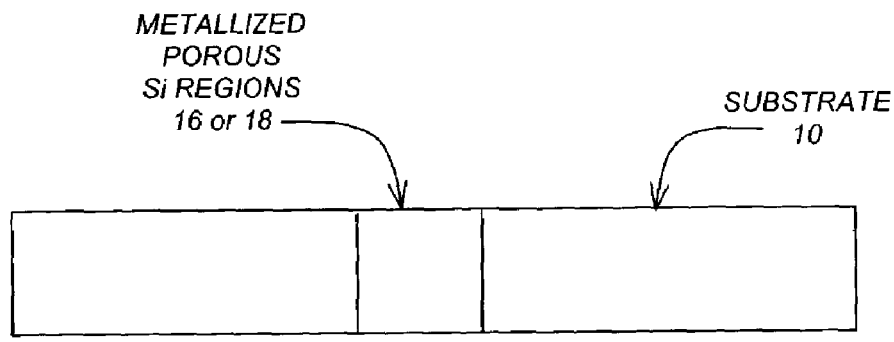
FIGS. 4A, 4B and 4C are cross-sectional side views of the structures of FIGS. 1, 2 and 3, respectively.
Figure 4B:
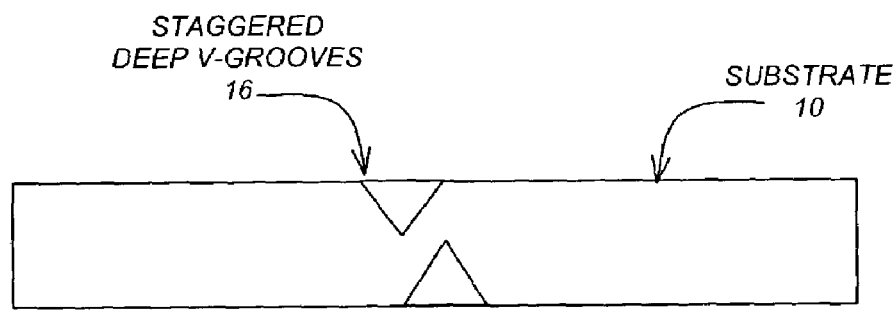
Figure 4C:
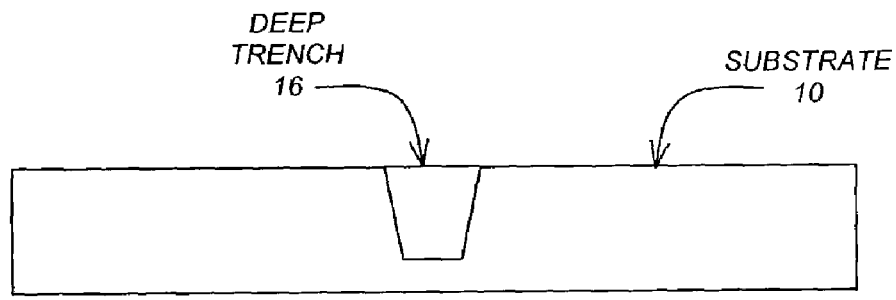

FIGS. 4A, 4B and 4C are cross-sectional side views of the structures of FIGS. 1, 2 and 3, respectively. FIG. 4A illustrates the metallized porous Si regions 16 or 18 extending through the substrate 10, FIG. 4B illustrates the staggered deep V-grooves 16 etched into the Si substrate 10 from both the front and the back of the substrate 10, and FIG. 4C illustrates the deep trench 16 etched into one side of the Si substrate 10.

Within the realm of integrated circuit technology, there are two potential applications using the present invention. Both applications address important issues associated with mixed-signal integrated circuits, which comprise a family of newly emerged type of integrated circuits that is used for cellular telephones, portable electronics, high speed modems, and data storage devices, such as computer hard drives.

A first application provides one or more metallized posts 18 on the substrate as low impedance paths to ground which is typically located at the backside of the chip. These posts 18 can be used as "true ground" points, i.e. points with very low impedance contact to the ground potential outside the chip, across the substrate 10. Such posts 18 have very short paths to ground points, as compared to typical ground lines in conventional Si integrated circuit technology. As a result, these posts 18 have much lower impedance to ground, especially for high frequency signals.

A second application creates the metallized moat 16 from a metallized porous Si region. Alternatively, the second application creates the metallized moat 16 by etching deep V-grooves or trenches in the Si substrate 10 and then depositing metals in the V-grooves or electroplating the trenches. In this second application, the metallized moat 16 shields the noise sensitive circuits 14 from high frequency noise generated by the noisy circuits 12. The metallized moat 16, in essence, creates a conducting cage, which is an electromagnetic shield that reduces RF crosstalk between the circuits 12 and 14.

As noted above, metallized porous Si regions can be used for both the first and second applications, whereas the metal-filled deep V-grooves and trenches are more suited for the noise isolation of the second application. Moreover, while the preferred embodiment uses Si substrates, other semiconductor substrates, such as GaAs (gallium arsenide) and InP (indium phosphide), may be used in alternative embodiments, especially in applications involving the V-grooves and trenches.

Figure 5:
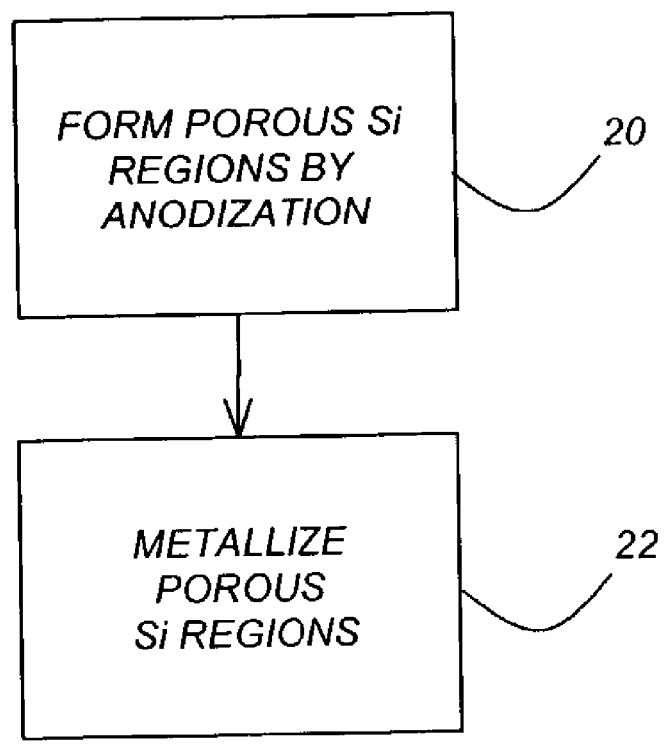
FIG. 5 is a flowchart illustrating the process steps used in creating metallized porous Si regions according to the preferred embodiment of the present invention.

FIG. 5 is a flowchart illustrating the process steps used in creating the metallized porous Si regions according to the preferred embodiment of the present invention.

Block 20 represents the formation of porous Si regions being performed by anodization, which is a well-known art that was first invented about half a century ago. In this step, the surface of the Si substrate is exposed to HF (hydrogen fluoride) containing an electrolyte. Porous Si forms into the Si substrate when an electrical current is passed through the Si-electrolyte interface with the Si substrate acting as the anode. Adjusting the HF concentration in the electrolyte and the current density during anodization alters the microstructure of the porous Si region so formed.

Block 22 represents the metallization of the porous Si regions being performed. The porous Si regions, with their interconnected pores, provide an excellent skeleton for metal deposition. Metals can be introduced into the porous Si regions in a number of different ways: by vapor deposition, solid state interdiffusion and reaction, and liquid state penetration. Because the porous Si regions each have a very large interconnected internal surface area, a capillary effect can be used to facilitate the penetration of any low melting point molten metal that wets the surface of the Si substrate throughout the entire porous Si region.

Two metals that fit the low melting point requirement are Au (gold) and Al (aluminum). The eutectic point of Au—Si is 370 degrees C. and that of Al—Si is 577 degrees C. Both metals are acceptable with respect to processing of integrated circuit devices on Si substrates.

Since Au is a deep trap impurity in Si, the Au penetration is followed with a penetration by molten Sn (tin) or an Sn-based solder. Sn will fill up the pores of the porous Si regions. Moreover, Sn serves the important function of retaining Au from outdiffusion, because of Au—Sn intermetallic compound formation. Sn also provides mechanical strength to the otherwise porous structure.

Figure 6:
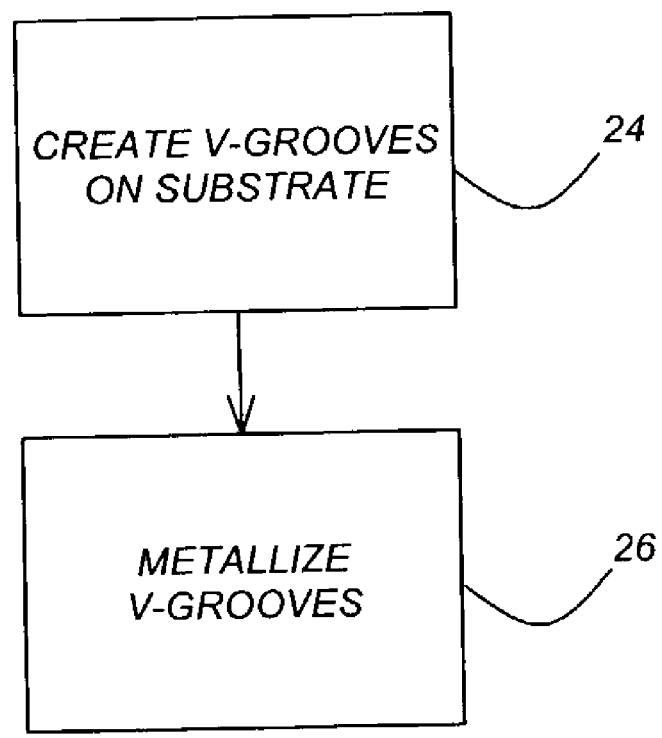
FIG. 6 is a flowchart illustrating the process steps used in creating V-grooves for a metallized moat according to the preferred embodiment of the present invention.

FIG. 6 is a flowchart illustrating the process steps used in creating the V-grooves for the metallized moat 16 according to the preferred embodiment of the present invention.

Block 24 represents the V-grooves being created along a [110] direction on an (001) surface of the Si substrate can be created using standard lithography techniques, followed by an anisotropic wet etching in solutions such as KOH (potassium hydroxide). The step may prepare V-grooves on both surfaces of the Si substrate for isolation purposes. The width of the V-groove is selected to give a depth of the V-groove that is about half the thickness of the substrate.

Block 26 represents the metallization of the V-grooves being performed. A lift-off process is used to deposit a multilayer metallic thin film (the total thickness of which is preferably on the order of a few hundred nanometers) into the V-grooves. For example, a trilayer of Cr/Cu/Au (chromium/copper/gold) or Ti/Ni/Pd (titanium/nickel/palladium) can be used. The resulting structure can be strengthened by a flow of molten solder into the V-grooves using a horizontal capillary effect. The solder may be Pb-free (lead-free) alloys such eutectic SnAg (tin-silver) or SnAgCu (tin-silver-copper) with a melting point around 220 degrees C.

Figure 7:
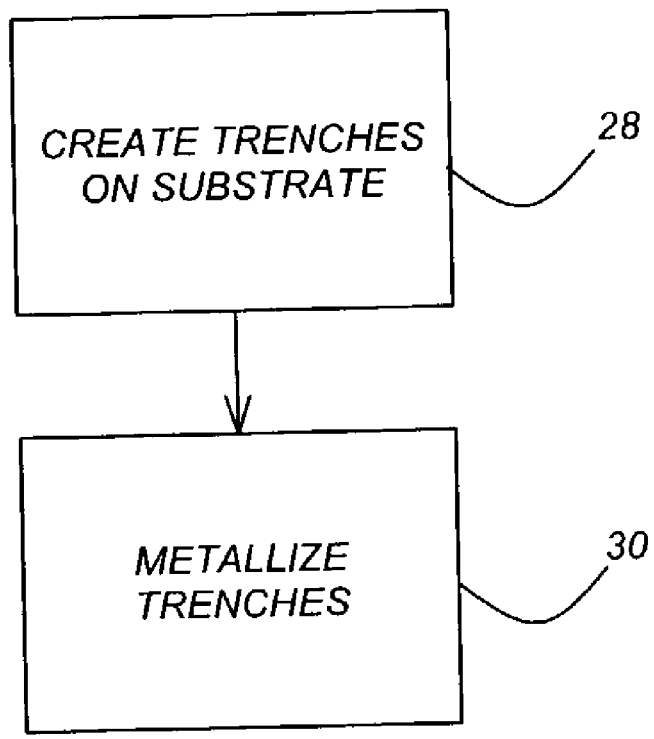
FIG. 7 is a flowchart illustrating the process steps used in creating trenches for a metallized moat according to the preferred embodiment of the present invention.

FIG. 7 is a flowchart illustrating the process steps used in creating the trenches for the metallized moat 16 according to the preferred embodiment of the present invention.

Block 28 represents the trenches being created along a [110] direction on an (001) surface of the Si substrate can be created using standard lithography techniques, followed by an anisotropic wet etching in solutions such as KOH.

Block 30 represents the metallization of the trenches being performed. Preferably, the Cu is deposited into the trenches by electro-plating or chemical vapor deposition (CVD). The entire trench can be filled with Cu, or a layer of Cu can be deposited and the rest of the trench filled with molten solder.

Conclusion

This concludes the description of the preferred embodiment of the invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating highly conductive regions in semiconductor substrates for radio frequency applications, comprising:

forming one or more porous Si (silicon) regions on a Si substrate by anodization; and isolating a noisy circuit area on the Si substrate from a noise sensitive circuit area on the Si substrate by depositing one or more metals into the porous Si regions to create a metallized, localized porous Si region comprising a moat or trench that extends through the Si substrate and laterally separates the noisy circuit area from the noise sensitive circuit area on the surface of the Si substrate.

2. The method of claim 1, wherein the forming step comprises:

exposing a surface of the Si substrate to HF (hydrogen fluoride) containing an electrolyte; and passing an electrical current through a Si-electrolyte interface with the Si substrate acting as the anode in order to form the porous Si regions on the Si substrate.

3. The method of claim 2, further comprising adjusting the HF concentration in the electrolyte and the electrical current density during anodization to alter a microstructure of the porous Si regions.

4. The method of claim 1, wherein the metals are deposited into the porous Si regions by vapor deposition, solid state interdiffusion and reaction, or liquid state penetration.

5. The method of claim 1, wherein the metal is Au (gold) or Al (aluminum).

6. The method of claim 5, wherein a penetration by Au is followed with a penetration by molten Sn (tin) or an Sn-based solder.

7. The method of claim 1, further comprising creating one or more metallized posts, in the noisy circuit area, from the metallized, localized porous Si regions, wherein the metallized posts extend through the substrate and act as true ground points.

* * * * *